United States Patent
Wu et al.

[11] Patent Number: 6,165,865
[45] Date of Patent: Dec. 26, 2000

[54] METHOD OF FABRICATING DUAL CYLINDRICAL CAPACITOR

[75] Inventors: King-Lung Wu, Tainan Hsien; Chuan-Fu Wang, Taipei Hsien, both of Taiwan

[73] Assignee: United Microelectronics Corp., Hsinchu, Taiwan

[21] Appl. No.: 09/183,577

[22] Filed: Oct. 30, 1998

[51] Int. Cl.[7] .................................................. H01L 21/20
[52] U.S. Cl. ........................................... 438/396; 438/253
[58] Field of Search ..................................... 438/239, 253, 438/254, 255, 256, 396, 397, 398, 399

[56] References Cited

U.S. PATENT DOCUMENTS

| | | | |
|---|---|---|---|
| 5,126,280 | 6/1992 | Chan et al. | 438/253 |
| 5,604,146 | 2/1997 | Tseng | 438/253 |
| 5,759,888 | 6/1998 | Wang et al. | 428/239 |
| 5,821,139 | 10/1996 | Tseng | 438/239 |
| 5,861,675 | 12/1997 | Sasaski et al. | 257/764 |
| 5,869,382 | 6/1997 | Kubota | 438/396 |

*Primary Examiner*—Carl Whitehead, Jr.
*Assistant Examiner*—Jeff Vockrodt
*Attorney, Agent, or Firm*—Hickman, Coleman & Hughes, LLP

[57] ABSTRACT

A method of forming a dual cylindrical capacitor on a semiconductor substrate having at least a device isolation structure and a transistor thereon is provided, wherein the transistor includes at least a gate and a source/drain region. A first insulation layer and a second insulation layer are formed on the substrate. An opening comprising an lower part penetrating through the first insulation layer and an upper part penetrating through the second insulation layer is formed to expose the source/drain region. A conductive layer is formed on the second insulation layer to fill the lower part of the opening and to cover a surface of the upper part of the opening. A spacer is formed on a part of the conductive layer on a side wall of the larger opening. A conductive spacer is formed on the spacer. The spacer is removed.

14 Claims, 4 Drawing Sheets

METHOD OF FABRICATING DUAL CYLINDRICAL CAPACITOR

BACKGROUND OF THE INVENTION

1. Field of the Invention

The invention relates in general to a method of fabricating a capacitor, and more particularly, to a method of fabricating a dual cylindrical capacitor in a dynamic random access memory (DRAM).

2. Description of the Related Art

As the functions of microprocessor become more and more versatile, the program and the calculation run by a software becomes more and more sizeable. The storing capacitance of a memory is required to be larger and larger. However, as the integration of semiconductors increases, the device or circuit is shrunk according to the design rule of the fabrication process, therefore, the storing capacitance of a capacitor is reduced.

The capacitor plays as a heart of a DRAM, the more charges the capacitor can store, the less it is affected by noise, for example, soft error caused by an α particle, while accessing data. Furthermore, the frequency of refresh can be reduced. Currently, methods such as fabricating a trench-shape capacitor and reducing the thickness of the dielectric layer are used to increase the capacitance of a capacitor. The latter one is often restricted by the yield and reliability of the product.

Recently, hemispherical-grain polysilicon and stack type bottom structures are used for bottom electrode to increase the surface area. However, the cell having a stack type bottom electrode often has a height higher than the periphery circuit region, therefore, causes the problems in cell planarization and metallization.

In addition, in the fabrication process of forming a capacitor a photo-resist layer is used to define the structure of the capacitor. During the photolithography and etching process, if misalignment occurs, the result of etching is affected, and the faulty devices or product are increased.

SUMMARY OF THE INVENTION

It is an object of the invention to provide a method of fabricating a dual cylindrical capacitor. The dual cylindrical capacitor is formed with an increased surface area, so that the capacitance is increased.

To achieve the above-mentioned objects and advantages, a method of fabricating a dual cylindrical capacitor is provided. A method of forming a dual cylindrical capacitor on a semiconductor substrate having at least a device isolation structure and a transistor thereon is provided, wherein the transistor includes at least a gate and a source/drain region. A first insulation layer and a second insulation layer are formed on the substrate. An opening comprising an lower part penetrating through the first insulation layer and an upper part penetrating through the second insulation layer is formed to expose the source/drain region. A conductive layer is formed on the second insulation layer to fill the lower part of the opening and to cover a surface of the upper part of the opening. A spacer is formed on a part of the conductive layer on a side wall of the larger opening. A conductive spacer is formed on the spacer. The spacer is removed.

In another embodiment of the invention, a second conductive layer is formed over the whole substrate instead of forming the conductive spacer on the spacer. The conductive layer is then removed by etch back or chemical mechanical polishing with the spacer as an etch or a polishing stop. The spacer is then removed.

Both the foregoing general description and the following detailed description are exemplary and explanatory only and are not restrictive of the invention, as claimed.

DESCRIPTION OF THE PREFERRED EMBODIMENTS

Figure 1A:
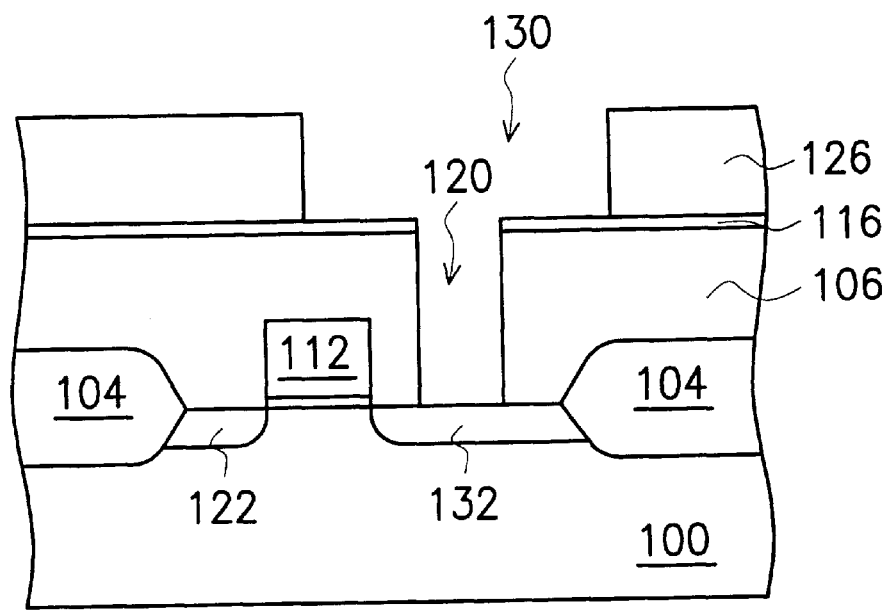
FIG. 1A to FIG. 1F shows a fabricating method of forming a dual cylindrical capacitor in a first embodiment according to the invention; and FIG. 2A to FIG. 2B shows a fabricating method of forming a cylindrical capacitor in a second embodiment according to the invention.

FIG. 1A to FIG. 1F shows a method for forming a capacitor coupled with source/drain region 132 among the source/drain regions 122 and 132 of a metal-oxide semiconductor (MOS) device on a substrate 100. The MOS device further comprises a gate 112 and is formed in an active region of the substrate 100. The active region is isolated by an isolation structure 104. It is appreciated that persons skilled in the art may also apply the fabrication method of forming a capacitor introduced in this embodiment to couple with conductive regions other than the source/drain region of a MOS device of a substrate. The substrate 100 is covered by a first insulation layer 106, an etch stop layer 116, and a second insulation layer 126. An opening comprising two parts, a lower part 120 to penetrate through the first insulation layer 106 and the etch stop layer 116, and a second part 130 to penetrate through the second insulation layer 126, is formed to expose the source/drain region 132. The opening can be formed by a dual damascene process which is a prior art technique and is not to describe here. Typically, by forming the opening by a dual damascene process, the upper part of the opening 130 is formed larger than the lower part of the opening 120. Therefore, the lower part of the opening 120 is referred as a smaller opening 120, while the upper part of the opening 130 is referred as a larger opening 130.

Figure 1B:
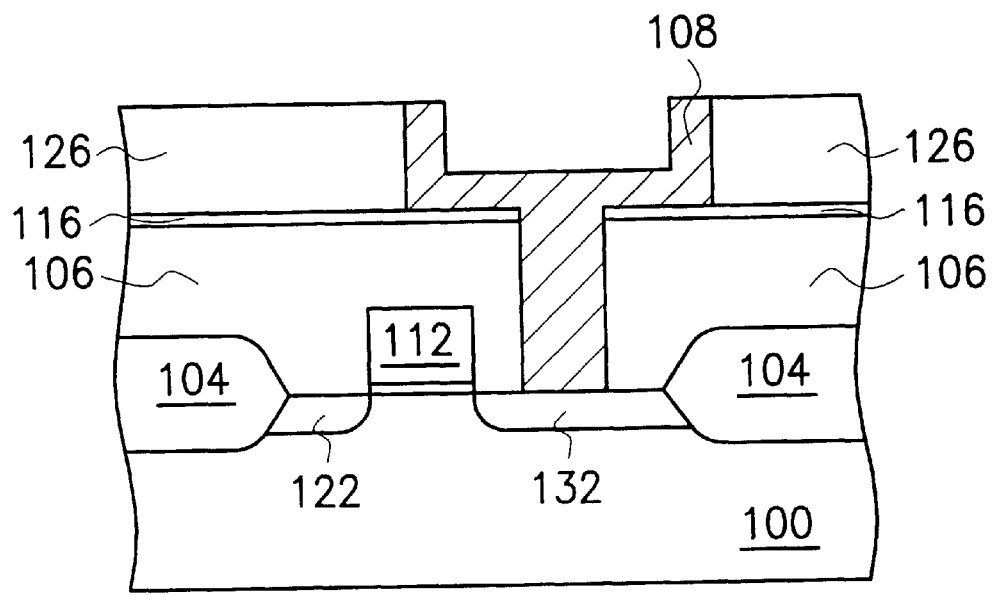

In FIG. 1B, a conductive layer, for example, a polysilicon layer having a thickness of about 500 Å in this embodiment, is formed on the second insulation layer 126 and the substrate 100. As a consequence, the smaller opening 120 is filled with the polysilicon layer, while the surface of the larger opening 130 is covered by a conformal polysilicon layer 108. The portion of the polysilicon layer 108 on the second insulation layer 126 is then removed, for example, by etch back or chemical mechanical polishing (CMP) with the top of the spacer 136 as an etch or polishing stop.

Figure 1C:
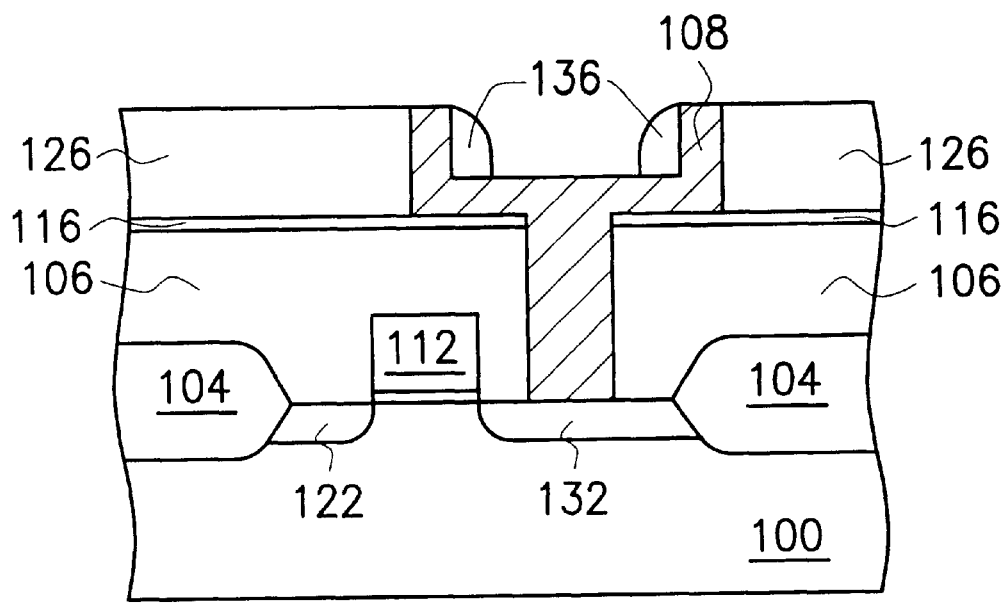

In FIG. 1C, a dielectric layer is formed to cover the whole surface of the substrate 100 with a thickness of about 500 Å. The actual thickness of the dielectric layer is determined by the depth of the larger opening 130. Preferably, the dielectric layer is formed by material such as tetra-ethyl-ortho-silicate (TEOS). The dielectric layer is then etched back to remain a spacer 136 to cover the polysilicon layer 108 on a side wall of the larger opening 130.

Figure 1D:
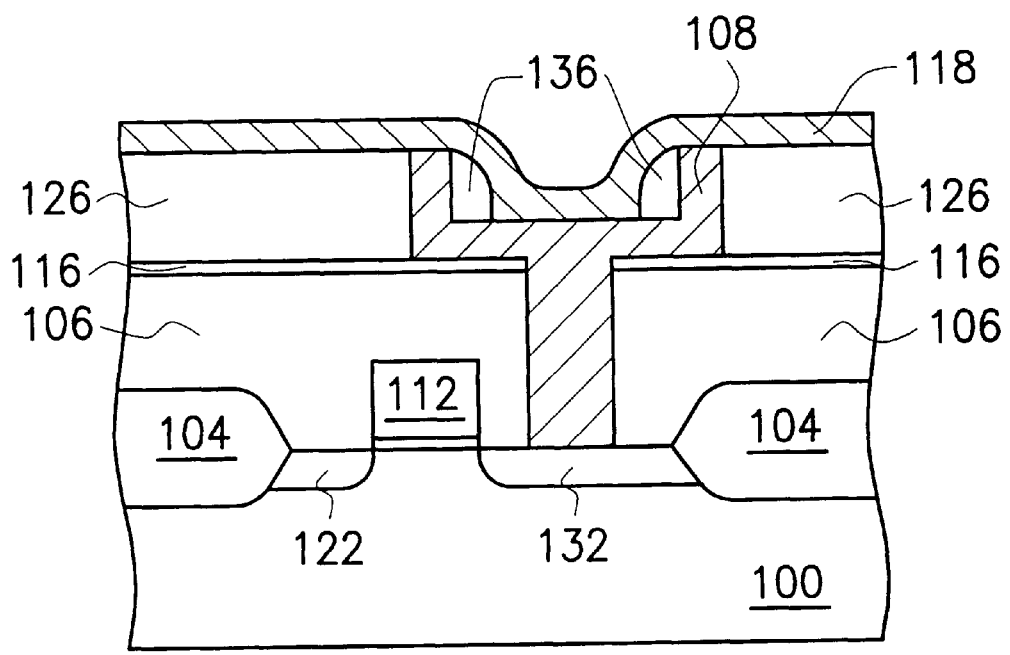
Figure 1E:
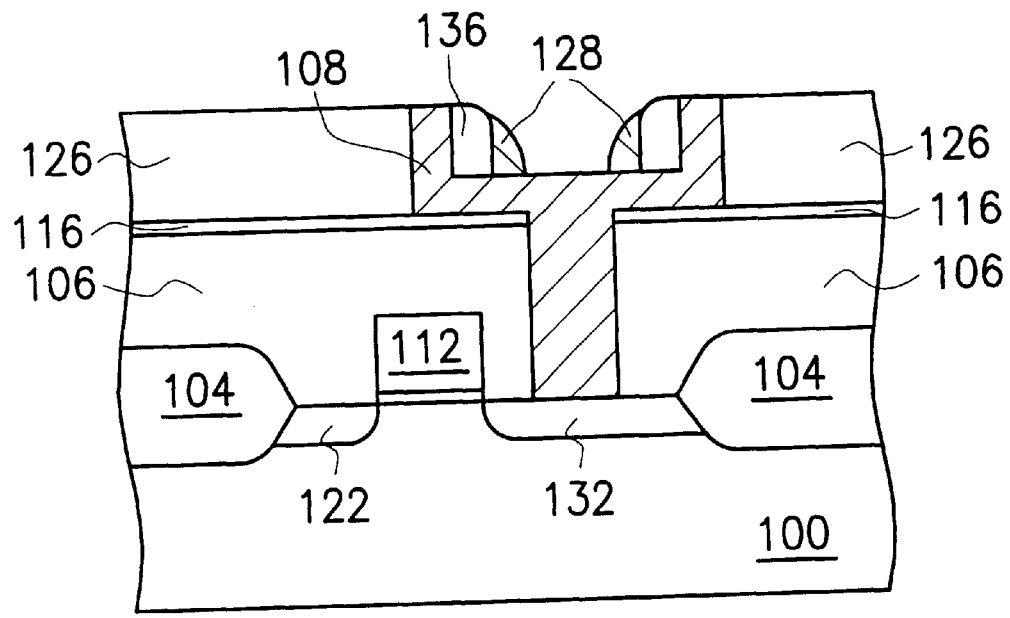

In FIG. 1D, a conductive layer, for example, a polysilicon layer 118 having a thickness of about 500 Å in this embodiment is formed over the whole surface of the substrate 100. Again, the actual thickness of the polysilicon layer 118 depends on the depth of the larger opening 130. Using etching back or chemical mechanical polishing process, a part of the polysilicon layer 128 is removed to remain a polysilicon spacer 128 on the spacer 136 as shown in FIG. 1E.

Figure 1F:
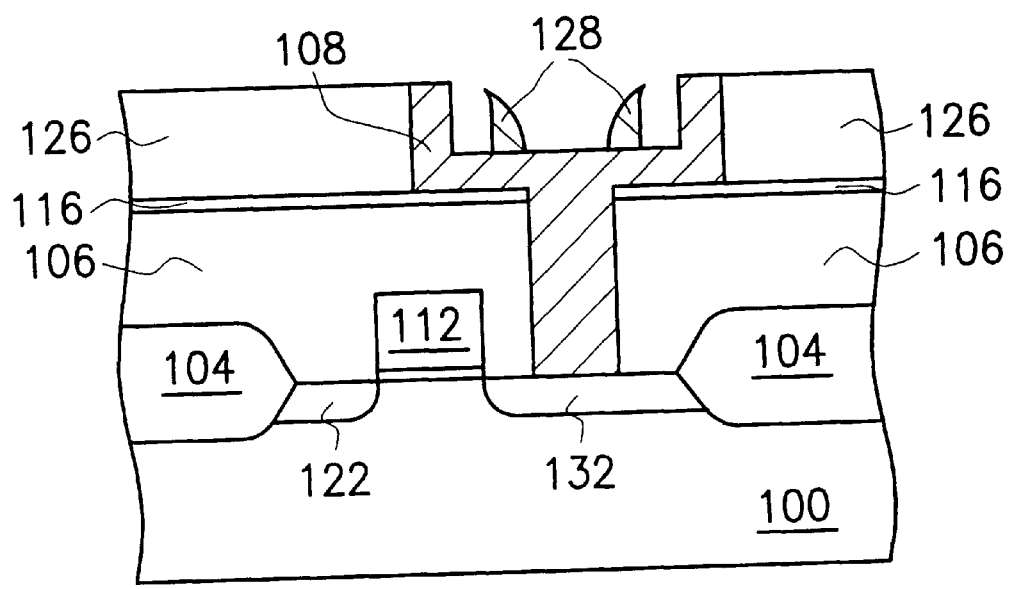

In FIG. 1F the spacer 136 is removed to form a dual cylindrical bottom electrode comprising the polysilicon layer 108 and the polysilicon spacer 128. To form a capacitor, a dielectric layer and a top electrode are then formed on the bottom electrode.

Figure 2A:
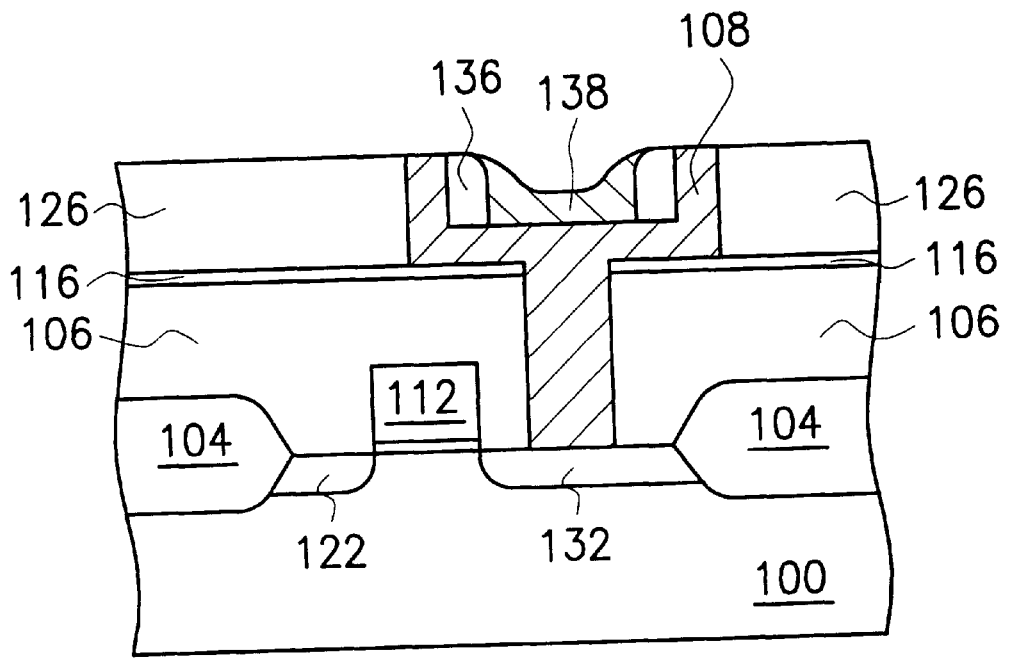
Figure 2B:
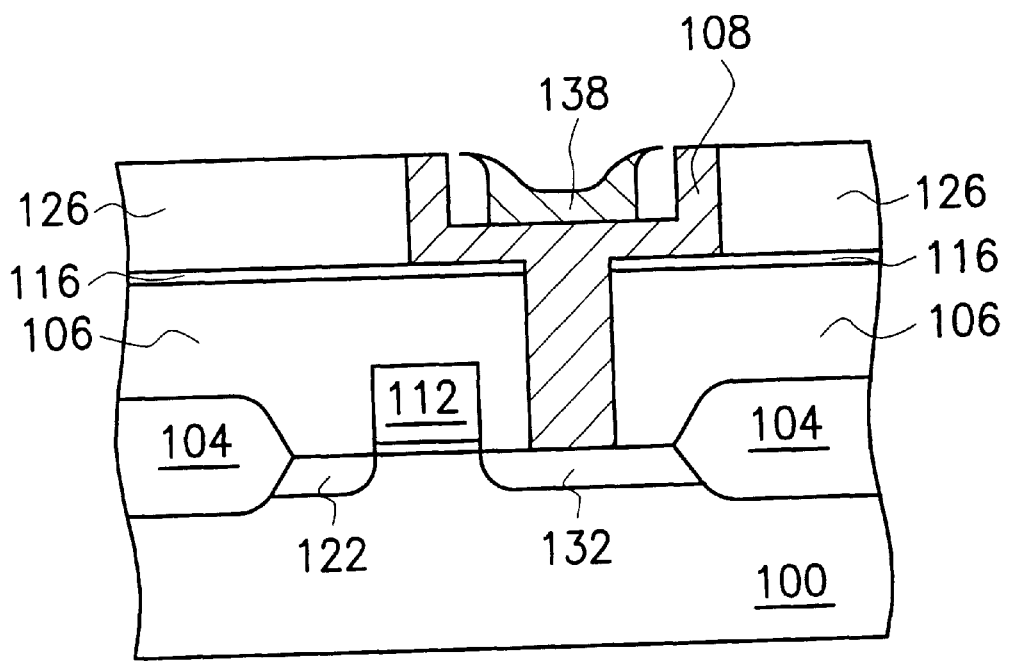

FIG. 2A and FIG. 2B show a modification of the first embodiment according to the invention. When the spacer 136 is formed to cover a part of the polysilicon layer 108 on a side wall of the larger opening 130 a polysilicon layer is formed to cover the whole surface of the substrate 100. The polysilicon layer is etched back or polished with the spacer 136 as an etch or polishing stop to remain the polysilicon layer 138 within the larger opening 130 only. The spacer is then removed to form a dual cylindrical bottom electrode of a capacitor. A dielectric layer and a top electrode are then formed the bottom electrode by a prior art technique.

The invention provides a method to increase the surface area of a bottom electrode of a capacitor without performing additional photolithography and etch process. Therefore, the misalignment caused by exposure is avoided. By increasing the surface area of the bottom electrode, the capacitance of the capacitor is improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a dual cylindrical capacitor on a semiconductor substrate having at least a device isolation structure and a transistor thereon, wherein the transistor includes at least a gate and a source/drain region, the method comprising:

forming a first insulation layer and a second insulation layer on the substrate;

forming an opening comprising a lower part penetrating through the first insulation layer and an upper part penetrating through the second insulation layer to expose the source/drain region, wherein the upper part is larger than the lower part;

forming a conductive layer on the second insulation layer to fill the lower part of the opening and to cover a surface of the upper part of the opening;

forming an insulating spacer on a part of the conductive layer on a side wall of the upper part of the opening after the step of forming the conductive layer;

forming a second conductive layer over the whole substrate:

forming a conductive spacer on the insulating spacer by etching back the second conductive layer using chemical mechanical polishing; and removing the insulating spacer.

2. The method according to claim 1, wherein the conductive layer includes a polysilicon layer.

3. The method according to claim 1, wherein the conductive spacer includes a polysilicon spacer.

4. The method according to claim 1, wherein the opening is formed by dual damascene process.

5. The method according to claim 1, the step of forming the conductive spacer further comprising:

removing the second conductive layer on the second insulation layer with the insulating spacer as a stop layer.

6. The method according to claim 5, wherein the second conductive layer is removed by etching back.

7. The method according to claim 1, further comprising the steps of:

forming a dielectric layer on a surface of the conductive spacer and a surface of the conductive layer after the insulating spacer is removed; and forming a top electrode on the dielectric layer.

8. A method of forming a bottom electrode coupled with a conductive region of a substrate, the substrate having an insulation layer with an opening exposing the conductive region, the method comprising:

forming a conductive layer conformal to the opening;

forming an insulating spacer to cover a part of the conductive layer in a side wall of the opening after the step of forming the conductive layer;

forming a second conductive layer over the whole substrate;

forming a conductive spacer to cover the insulating spacer by etching back the second conductive layer using chemical mechanical polishing; and removing the insulating spacer.

9. A method of forming a dual cylindrical capacitor on a semiconductor substrate having at least a device isolation structure and a transistor thereon, wherein the transistor includes at least a gate and a source/drain region, the method comprising:

forming a first insulation layer and a second insulation layer on the substrate;

forming an opening comprising a lower part penetrating through the first insulation layer and an upper part penetrating through the second insulation layer to expose the source/drain region, wherein the upper part is larger than the lower part;

forming a first conductive layer on the second insulation layer to fill the lower part of the opening and to cover a surface of the upper part of the opening;

forming an insulating spacer on a part of the first conductive layer on a side wall of the upper part of the opening after the step of forming the conductive layer;

forming a second conductive layer over the whole substrate;

removing a part of the second conductive layer with the insulating spacer as a stop, via chemical mechanical polishing; and removing the insulating spacer.

10. The method according to claim 9, wherein the first conductive layer includes a polysilicon layer.

11. The method according to claim 9, wherein the second conductive layer includes a polysilicon layer.

12. The method according to claim 9, wherein the opening is formed by dual damascene process.

13. The method according to claim 9, wherein the second conductive layer is removed by etching back.

14. The method according to claim 9, further comprising the steps of:

forming a dielectric layer on a surface of the conductive spacer and a surface of the conductive layer after the insulating spacer is removed; and forming a top electrode on the dielectric layer.

* * * * *